US007474707B2

(12) United States Patent
Kroeger

(10) Patent No.: US 7,474,707 B2
(45) Date of Patent: Jan. 6, 2009

(54) BANDWIDTH REDUCTION OF AN FM BROADCAST SIGNAL USING A BASEBAND PRECOMPENSATION TECHNIQUE

(75) Inventor: Brian William Kroeger, Sykesville, MD (US)

(73) Assignee: iBiquity Digital Corporation, Columbia, MD (US)

(*) Notice: Subject to any disclaimer, the term of this patent is extended or adjusted under 35 U.S.C. 154(b) by 723 days.

(21) Appl. No.: 10/937,619

(22) Filed: Sep. 9, 2004

(65) Prior Publication Data

US 2006/0050807 A1 Mar. 9, 2006

(51) Int. Cl.
*H04L 25/03* (2006.01)
*H03C 1/02* (2006.01)
*H04H 20/48* (2008.01)

(52) U.S. Cl. .......................... 375/296; 332/123; 381/3; 381/94.1

(58) Field of Classification Search ................ 375/295, 375/296, 1, 216, 142, 240, 297; 455/143, 455/42, 43, 114.2, 114.3; 332/117, 123, 332/124; 381/2, 3, 13, 14, 94.1, 94.2
See application file for complete search history.

(56) References Cited

U.S. PATENT DOCUMENTS 5,949,796 A * 9/1999 Kumar ...................... 370/529
6,128,350 A 10/2000 Shastri et al.
6,430,227 B1 8/2002 Kroeger et al.
6,510,175 B1 * 1/2003 Hunsinger et al. .......... 375/216
6,546,237 B1 * 4/2003 Glas .......................... 375/340
6,574,458 B1 * 6/2003 Bargauan .................... 375/296
6,639,949 B2 10/2003 Kroeger et al.
2003/0108123 A1 6/2003 Kroeger et al.
2003/0112890 A1 6/2003 Kroeger et al.
2003/0142758 A1 * 7/2003 Sakaue et al. ............... 375/295
2004/0076188 A1 4/2004 Milbar et al.

* cited by examiner

*Primary Examiner*—Betsy L Deppe
(74) *Attorney, Agent, or Firm*—Robert P. Lenart, Esq.; Pietragallo Gordon Alfano Bosick & Raspanti, LLP

(57) ABSTRACT

A method of processing a baseband multiplex signal comprises the steps of frequency modulating the baseband multiplex signal to produce a first modulated signal, filtering the first modulated signal to produce a first filtered signal, demodulating the filtered signal to produce a demodulated baseband multiplex signal, correcting the demodulated baseband multiplex signal to reduce or eliminate distortion in a predetermined frequency range of the demodulated baseband multiplex signal to produce a corrected signal, and frequency modulating the corrected signal to produce a second modulated signal. An apparatus that operates in accordance with the method is also provided.

26 Claims, 7 Drawing Sheets

CONVENTIONAL FM RECEIVER WITH STEREO DECODER

BANDWIDTH REDUCTION OF AN FM BROADCAST SIGNAL USING A BASEBAND PRECOMPENSATION TECHNIQUE

FIELD OF THE INVENTION

This invention relates to FM radio broadcasting, and more particularly to In-Band On-Channel FM radio broadcasting.

BACKGROUND OF THE INVENTION

It is well-known that the modulated (transmitted) bandwidth of an FM signal is larger than its baseband input signal. The multiplex baseband signal of an FM stereo broadcast has a one-sided bandwidth of 53 kHz. However, its frequency modulated output extends over an effective bandwidth of roughly 260 kHz (±130 kHz). Although the FM signal has a theoretically infinite bandwidth, the power spectral density at ±130 kHz is typically 40 dB lower than at its center frequency. Hybrid In-Band On-Channel (IBOC) FM systems utilize the channel spectrum for digital subcarriers on either sideband of the host FM analog signal. The digital subcarriers can be located in frequency ranges from 129 kHz to 199 kHz on either side of the host FM analog signal. The basic hybrid system places subcarriers sufficiently separated in frequency from the analog FM such that the mutual analog and digital interference is minimal and acceptable for broadcast quality. Optional digital subcarriers can extend closer to the FM host to permit increased digital capacity for optional digital services, depending on the hybrid mode of operation. The optional digital subcarriers can extend as close as 122, 115, or 101 kHz, depending on the hybrid mode of operation. However the analog FM signal has significant power in these frequencies and affects the utility of this portion of the spectrum for digital subcarriers.

There is a need for a method and apparatus that modifies the baseband multiplex signal in such a manner that is compatible with constant-envelope high power amplifiers (HPAs) in IBOC signal transmitters, while limiting or eliminating any resulting additional distortion to the demodulated audio in a receiver.

SUMMARY OF THE INVENTION

This invention provides a method of processing a baseband multiplex signal comprising the steps of frequency modulating the baseband multiplex signal to produce a first modulated signal, filtering the first modulated signal to produce a first filtered signal, demodulating the filtered signal to produce a demodulated baseband multiplex signal, correcting the demodulated baseband multiplex signal to reduce or eliminate distortion in a predetermined frequency range of the demodulated baseband multiplex signal to produce a corrected signal, and frequency modulating the corrected signal to produce a second modulated signal. These steps can be repeated to achieve an acceptable level of bandwidth reduction while the distortion is controlled to acceptably good levels.

In another aspect, the invention provides an apparatus for processing a baseband multiplex signal. The apparatus comprises a first frequency modulator for frequency modulating the baseband multiplex signal to produce a first modulated signal, a filter for filtering the first modulated signal to produce a first filtered signal, a detector for demodulating the filtered signal to produce a demodulated baseband multiplex signal, a correction circuit for correcting the demodulated baseband multiplex signal to reduce or eliminate distortion in a predetermined frequency range of the demodulated baseband multiplex signal to produce a corrected signal, and a second frequency modulator for frequency modulating the corrected signal to produce a second modulated signal.

DETAILED DESCRIPTION OF THE INVENTION

This invention provides a method for reducing the FM analog signal power in the region from 101 to 129 kHz from the center frequency of an FM hybrid IBOC signal. The method modifies the baseband multiplex signal in such a manner that it is compatible with constant-envelope high power amplifiers (HPAs) while limiting or eliminating any resulting additional distortion to the demodulated audio in a receiver. The invention improves the compatibility by reducing the FM analog signal power in the extended region of the IBOC signal sidebands.

To describe the invention it is instructive to first describe the frequency channel spectra of the FM Hybrid IBOC signal to identify the issues encountered with the extended subcarriers.

Figure 1:
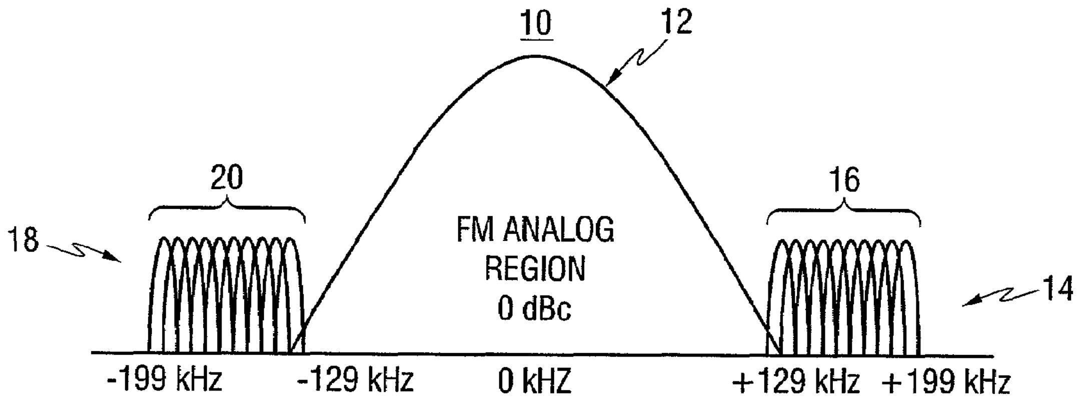
FIG. 1 is an FM Hybrid IBOC signal spectrum for a basic transmission mode (MP1).

A spectral plot of the basic (Mode MP1) FM Hybrid IBOC signal 10 is illustrated in FIG. 1. The signal includes an analog modulated carrier signal 12, a first plurality of subcarriers 14 modulated by a digital signal and located in an upper sideband 16, and a second plurality of subcarriers 18 modulated by a digital signal and located in a lower sideband 20. In one embodiment, each sideband includes 191 OFDM subcarriers having a total power spectral density that is 23 dBc below the analog modulated carrier. The FM analog signal shown in FIG. 1 is typical for illustration purposes, but it is nonstationary in time and depends on audio processing and audio content. The digital subcarriers extend from 129 kHz to 199 kHz on either side of the centered, analog modulated FM signal. Minimal interference from the FM analog modulated carrier to the digital subcarriers is experienced in this mode due to the careful spectral placement of the innermost subcarriers in each sideband, although the subcarrier at 129 kHz is roughly 10 dB above the analog FM in its subcarrier bandwidth when the input stereo audio signal is processed in the typical manner.

The FM Hybrid IBOC signal spectrum of FIG. 1 is for basic mode MP1 of the iBiquity Digital Corporation HD Radio™ system, and shows minimal interference to digital subcarriers from the FM analog host signal.

Figure 2:
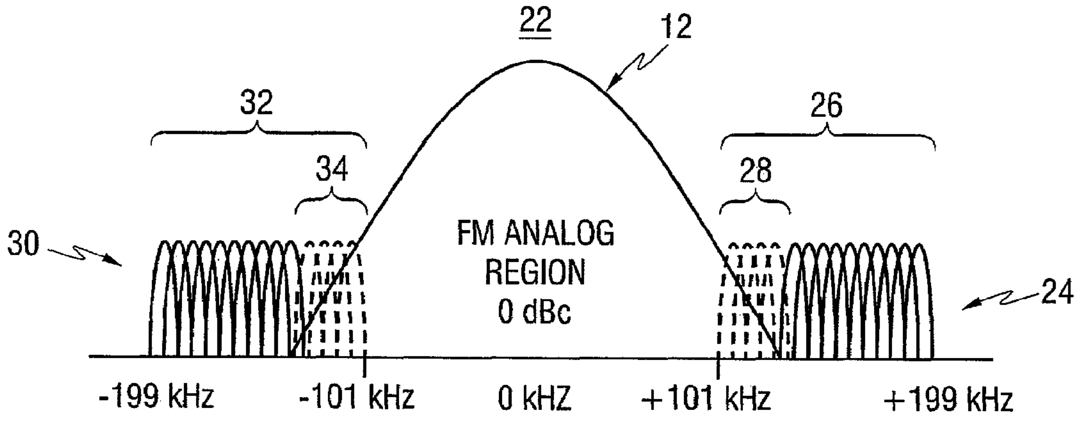
FIG. 2 is an FM Hybrid IBOC signal spectrum for an extended transmission mode (MP4).

FIG. 2 shows the fully extended FM Hybrid signal 22 used in mode MP4 of the iBiquity Digital Corporation HD Radio™ system. In this case, the subcarriers 24 in an upper sideband 26 include optional extended subcarriers 28 and the subcarriers 30 in a lower sideband 32 include optional extended subcarriers 34. The optional extended subcarriers extend to within 101 kHz of the center frequency of the channel. FIG. 2 shows that these extended subcarriers will experience degradation due to the overlapping FM analog signal in this region. In two other modes, MP2 and MP3 (not shown) the optional extended subcarriers extend to within 122 and 115 kHz, respectively, from center frequency. FIG. 2 shows significant interference to the extended digital subcarriers from the FM analog host signal in the extended mode MP4 FM Hybrid IBOC signal spectrum.

Figure 3:
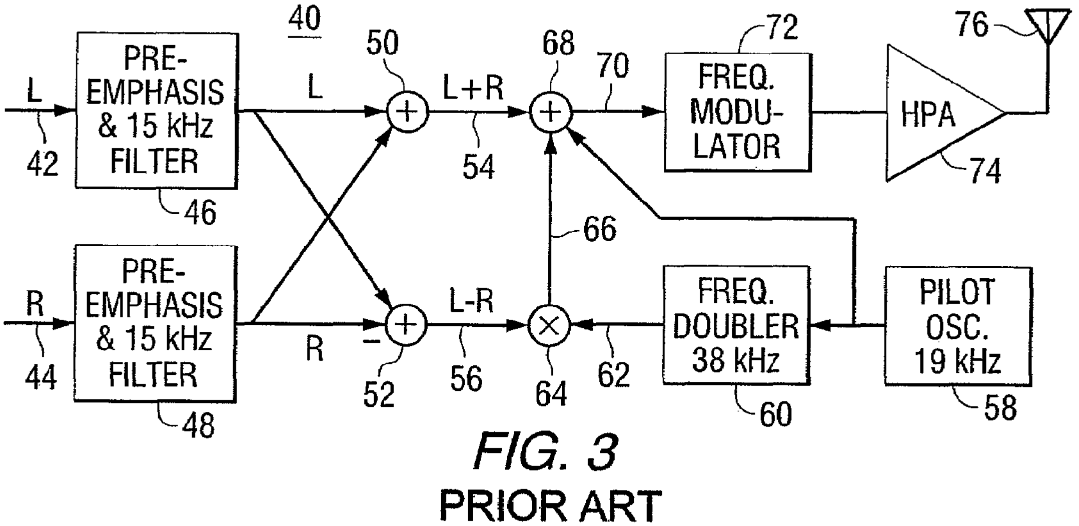
FIG. 3 PRIOR ART
FIG. 3 is a simplified functional block diagram of a conventional FM stereo transmitter that can be modified to operate in accordance with this invention.

A simplified functional block diagram of a conventional FM stereo transmitter 40 is shown in FIG. 3. The transmitter includes inputs 42 and 44 for accepting L (left) and R (right) channel audio signals which are then pre-emphasized as a noise-mitigating technique as illustrated by blocks 46 and 48. The L and R signals are matrixed using summation points 50 and 52 to produce the sum L+R (monophonic) and difference L−R (stereo) signals on lines 54 and 56. A pilot oscillator 58 and frequency doubler 60 produce a signal on line 62 that is combined (DSBSC-modulated) with the L−R signal in mixer 64 to produce the stereo subcarrier at 38 kHz on line 66. The L+R, L−R and the 19 kHz pilot are added at summation point 68 to produce the FM stereo multiplex signal on line 70. This multiplex signal is then frequency-modulated by a frequency modulator 72 and amplified in the high-power amplifier (HPA) 74 to produce the broadcast transmitter FM output that is delivered to an antenna 76.

Figure 4:
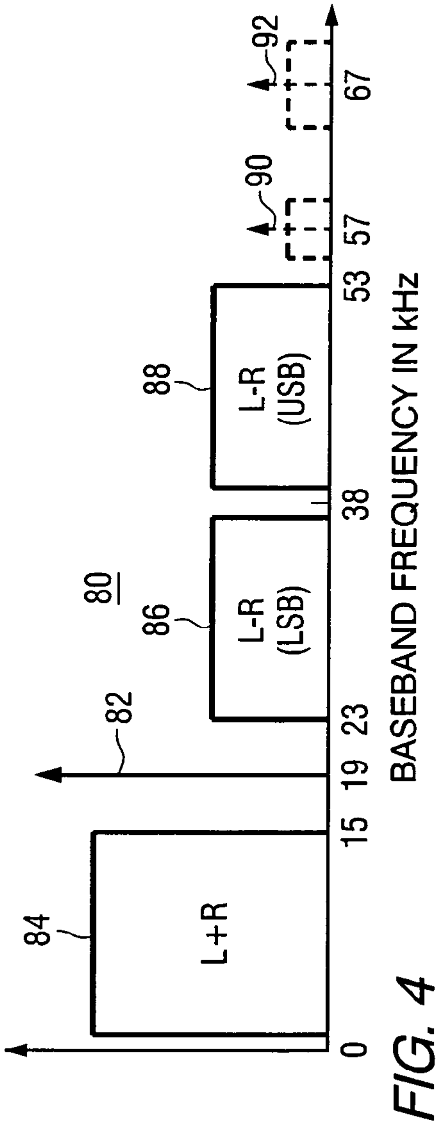
FIG. 4 is a schematic representation of an FM multiplex baseband signal.

A spectral representation of the baseband FM multiplex signal 80 is presented in FIG. 4. This signal is observed at the input to the frequency modulator 72 of FIG. 3. The signal includes a 19 kHz pilot 82, an L+R component 84, an L−R lower sideband component 86, an L−R upper sideband component 88, and optional subsidiary communications authorization subcarriers (SCAs) 90 and 92. Notice that the stereo audio components of this signal extend to 53 kHz. The optional SCAs are shown for informational purposes only, but may be affected by the bandwidth reduction methods discussed below.

Figure 5:
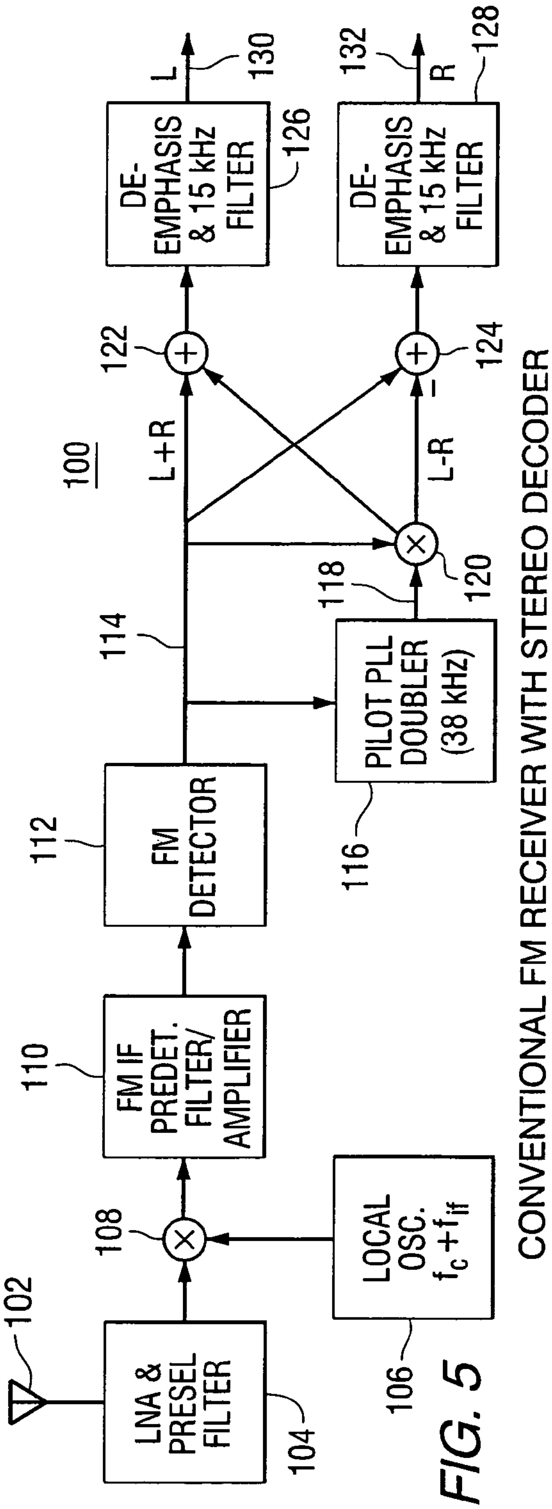
FIG. 5 is a simplified functional block diagram of a conventional FM receiver with a stereo multiplex decoder.

A simplified functional diagram of a conventional FM stereo receiver 100 is shown in FIG. 5. An FM IBOC signal received by antenna 102 enters the low noise amplifier (LNA) and preselection filter 104 to bring the signal sufficiently above the noise floor of the subsequent components, while eliminating most unwanted signals. The local oscillator (LO) 106 and mixer 108 translate the signal frequency to a nominal IF frequency (typically 10.7 MHz) that passes through a FM predetect filter and amplifier 110 for subsequent FM detection by FM detector 112 to output the FM baseband multiplex signal on line 114. The 19 kHz pilot is recovered via phase locked loop (PLL) 116 where it is doubled in frequency to produce the 38 kHz subcarrier on line 118. The 38 kHz subcarrier is used to demodulate the L−R signal using mixer 120. Next the L+R and L−R signals are dematrixed as illustrated by adders 122 and 124, and de-emphasized as shown by blocks 126 and 128 to produce the L and R output audio signals on lines 130 and 132. The selectivity of the FM IF predetection filter can be adjusted to accommodate the interference conditions. Furthermore, the L−R signal into the dematrix can be suppressed to further reduce the noise added by the stereo L−R component. Well-designed receivers will adaptively adjust both the predetection bandwidth and the postdetection bandwidth, and "blend-out" the L−R signal to improve the compromise between postdetection noise and audio fidelity in the presence of noise or interference.

A brief summary of the relevant noise and interference issues follows. Noise can be characterized as additive white Gaussian noise (AWGN), such as thermal noise at the front end of the receiver or background noise. This noise is spectrally flat entering the predetection filter in the receiver. FM detection of the baseband signal in the presence of AWGN results in a non-flat output noise spectrum where the postdetection noise density is proportional to the square of the frequency from zero Hz. For example, the postdetection noise density at 15 kHz is 225 times (23.5 dB greater than) the noise density at 1 kHz. This degradation is mitigated by the de-emphasis of the output audio signal filter in the receiver for monophonic reception. Unfortunately this de-emphasis is not as effective for the stereo L−R signal centered at 38 kHz. The noise density centered at 38 kHz is a factor of 1444 (31.6 dB) greater than the noise density at 1 kHz, while the noise at 53 kHz is a factor of 2809 (34.5 dB) greater. It can be shown that the noise contributed by the upper sideband (USB) in the 38 to 53 kHz range is 3.4 dB greater than the lower sideband (LSB) in the 23 to 38 kHz range.

An FM stereo signal can be generated using a simulation model of the transmitter shown in FIG. 3. The L and R audio components are filtered Gaussian noise in this simulation with 30% modulation, typical of the audio processing in an FM system. The Gaussian noise is filtered with a linear taper in frequency from 0 dB at near 0 Hz to 12 dB at 15 kHz to simulate a typical audio spectral characteristic. The input audio stereo separation for this particular simulation signal is set at 50%, meaning that 50% of the signal is common in both the L and R components, while the remaining 50% is uncorrelated.

Figure 6:
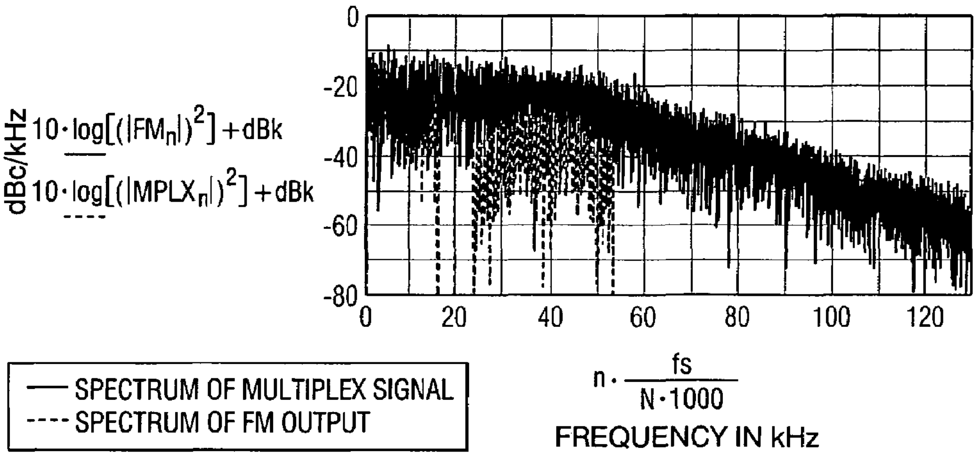
FIG. 6 is a spectral plot (one-sided) of an actual FM signal and its input baseband multiplex signal.

FIG. 6 is a spectral plot (one-sided) of an actual FM signal and its input baseband multiplex signal. FIG. 6 shows a one-sided (positive frequencies only) spectral representation of this signal, and illustrates the spectral compactness of this simulated baseband multiplex signal to 53 kHz, while the frequency-modulated output extends well beyond that. The spectral components of the FM output signal beyond 100 kHz are of special interest here since these components affect the extended digital subcarriers in the extended hybrid modes of the IBOC signal.

One simple method of FM bandwidth reduction could be to eliminate the stereo component and the 19 kHz pilot signal from the analog FM broadcast. Although this will sufficiently limit the bandwidth, it is not a desirable option for the broadcaster who wants to offer stereo to its analog FM listeners. Another simple option is to reduce the agc-like audio processing typically used by the broadcaster to raise the audio signal above the noise. However this is also undesirable since it offers inferior audio quality.

Another method of FM bandwidth reduction could be to place a bandpass filter immediately after the HPA at the transmitter. This bandpass filter would ideally have a flat (amplitude and group delay) passband out to about 96 kHz, for example, with a stopband at about 101 kHz, or wherever the extended subcarriers begin. However this is generally impractical since such high power filters with this kind of selectivity would be very large and costly. Furthermore, this would result in some distortion of the output of a receiver, since this filtering of the FM signal results in distortion due to the nonlinear nature of frequency modulation. However, this distortion may be tolerated by receiver manufacturers in the interest of suppressing noise due to adjacent interferers.

An alternate method of FM bandwidth reduction could be to place a bandpass filter immediately before the HPA at the transmitter. Although this would be acceptable if the HPA were linear, typical HPAs are not linear and require a constant envelope (amplitude) output signal for efficient operation. The filtering of this signal prior to the HPA would result in some amplitude modulation and would no longer have a constant-envelope characteristic. Some audio distortion of this subsequently received signal would result, but this may be acceptable. More importantly, if the filtered signal were applied to a typical HPA, then constant-envelope restoration of the signal would restore the HPA output to its original bandwidth. This clearly defeats the purpose of the bandwidth reduction.

Since the aforementioned methods of bandwidth reduction are undesirable, a better method for FM bandwidth reduction is sought which is compatible with the constant envelope characteristic of the HPA.

The method of this invention involves the modification (precompensation) of the baseband multiplex signal to achieve the desired FM bandwidth reduction. This would ensure compatibility with a constant-envelope HPA.

The effects of simple bandlimiting or filtering of the transmitted FM signal without any other modifications are reviewed first. Although this filtering is not practical with typical HPA (as previously discussed), it has the same effect as filtering at the receiver. The receiver can be simulated with various bandwidths without additional noise or interference. This has the same effect as limiting the transmitter bandwidth. Using the transmitter simulation model previously described, sharp bandpass filters having passbands of ±128 kHz, ±121 kHz, ±114 kHz and ±100 kHz were simulated since these bandwidths are associated with the MP1, MP2, MP3 and MP4 hybrid modes, respectively. The audio input signal at the transmitter was subtracted from the audio output at the receiver to measure the errors (or signal-to-noise ratio (SNR)) of the monophonic (L+R) and the stereo difference (L−R) signals. The SNR has been computed as the ratio (in dB) of the monophonic signal power to the error power (variance) in a 15 kHz bandwidth. These results are tabulated in Table 1.

TABLE 1

SNR of Received/Demodulated Mono and Stereo (Difference) Signals as a Function of Receiver Filter Bandwidth.

| | Receiver BW | | | |
|---|---|---|---|---|
| | ±128 kHz | ±121 kHz | ±114 kHz | ±100 kHz |
| SNR mono | 92 | 86 | 82 | 70 |
| SNR stereo | 59 | 53 | 48 | 39 |

The SNR of the L+R (monophonic) component was measured to be good in all cases of receiver filtering, since a typical receiver achieves roughly 60 dB SNR under ideal conditions. It should be noted that receivers in a selective fading multipath environment will experience lower performance than 60 dB, so the performance degradation will likely be dominated by the reception environment and not the receiver bandlimiting. Furthermore, the error noise measured in these cases is not necessarily random noise, but rather distortion or attenuation of the desired signal, which is more listenable than an equivalent amount of noise. For example 1% total harmonic distortion (THD) would be measured here as 40 dB SNR.

The L−R (stereo) component experiences considerably more distortion than its monophonic counterpart. This is typical of FM stereo receiver performance. The 39 dB SNR with ±100 kHz filtering may offer marginal performance for stereo reception. Stereo reception for filtering at ±114 kHz, or wider, is indicative of good stereo performance (48 dB SNR or better than 1% THD). The SNR for the stereo component is not necessarily indicative of noise, but rather the stereo separation peaks are more affected. Subjective testing should determine the actual degradation in quality. However it should be noted that well-designed selective receivers already perform filtering of this type in order to minimize the effects of interference, and the resulting quality is still perceived as good. Furthermore, the audio processing at the transmitter already has a similar effect.

The goal of the baseband precompensation method of this invention is to modify the baseband multiplex signal such that subsequent frequency modulation results in a controlled and reduced transmit bandwidth using a constant envelope HPA. This is done to improve compatibility with the MP2-MP4 hybrid modes. Furthermore, the distortion of the demodulated audio signal at the receiver should be minimized to acceptably good levels. This could also improve the performance of receivers with high selectivity, while minimizing the effects of adjacent interference.

Figure 7:
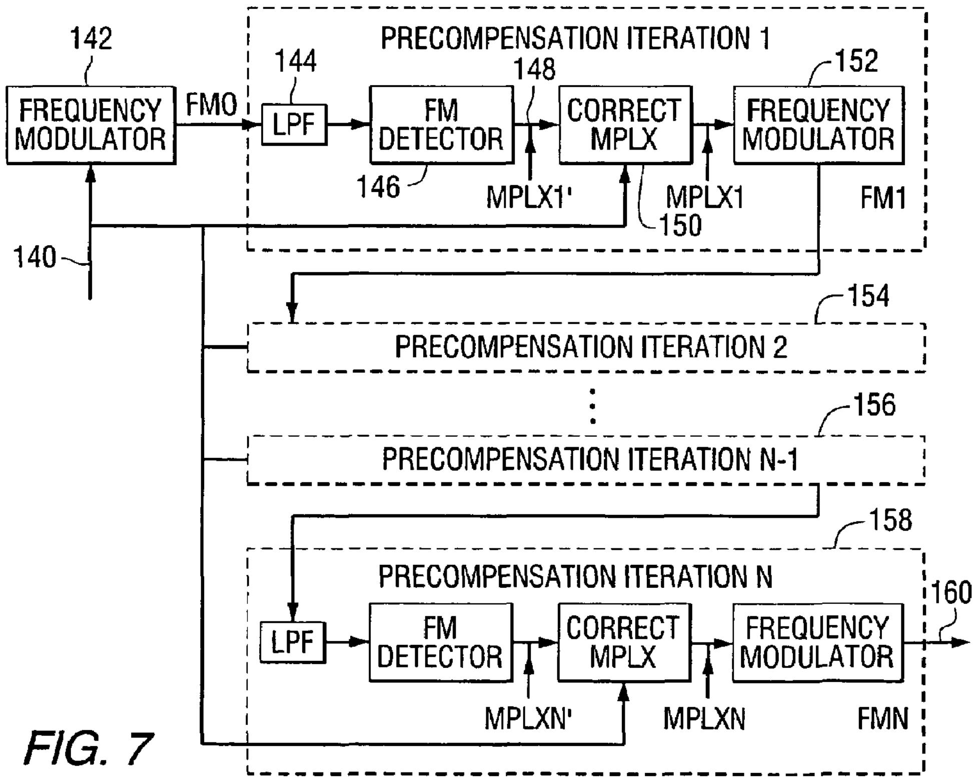
FIG. 7 is a functional block diagram of an FM bandwidth reduction procedure.

An iterative procedure is used in the transmitter exciter to control the bandwidth reduction. FIG. 7 is a functional block diagram of the FM bandwidth reduction procedure. This procedure starts by frequency-modulating the original multiplex baseband signal on line 140 in the normal manner as illustrated by block 142 to produce a first modulated signal FM0. For convenience, the FM signal is processed at a zero center frequency instead of its intended RF carrier frequency (88-108 MHz). The FM signal is then lowpass filtered 144 with the desired bandwidth (e.g. ±128, ±121, ±114, or ±100 kHz). The filtered frequency-modulated signal is then detected 146 to produce a detected baseband multiplex signal which is distorted due to the predetection filtering. This new multiplex baseband signal on line 148 is then corrected 150 to reduce or eliminate its distortion in the desired range of 0 to 53 kHz, but the distortion products above 53 kHz remain as a precompensation signal. This precompensation signal primarily occupies the bandwidth between, for example, 53 kHz and 100 kHz where it has little or no affect on the audio signal. Then the corrected signal is again modulated as illustrated by block 152 to produce a second modulated signal FM1 . The second modulated signal is detected to produce a second detected baseband multiplex signal. The second detected baseband multiplex signal is corrected to reduce or eliminate distortion in a predetermined frequency range of the second detected baseband multiplex signal to produce a second corrected signal, and the second corrected signal is frequency modulated to produce a third modulated signal. This process continues for a number of iterations as shown in blocks 154, 156 and 158, wherein the modulated signal produced in each previous iterations is detected, the detected signal is corrected, and the corrected signal is frequency modulated to produce an FM output having a reduced bandwidth on line 160. The resulting baseband multiplex signal converges toward a new signal that produces the desired compact modulated spectrum with acceptably low distortion in the 0 to 53 kHz range.

This invention reduces the modulated FM signal bandwidth. This process results in some distortion of the baseband multiplex signal (not yet FM modulated). However, most of this distortion is in the frequency range outside of 53 kHz such that the intended audio components experience sufficiently small distortion. Although this would increase the effective bandwidth of the baseband multiplex signal, the FM modulated result actually has reduced bandwidth. The so-called precompensation distortion signal outside of 53 kHz has the effect of canceling the wideband frequency components of the FM modulated signal. This would not generally be intuitive since conventional FM theory (e.g. Carson's rule) would suggest that a wider-bandwidth baseband signal would generally produce a wider-bandwidth FM signal. The method of this invention intentionally has the opposite effect.

A key element in the iterative process is the manner in which the baseband signal is corrected in the 0 to 53 kHz range. If this signal is perfectly corrected in each iteration, then the resulting audio signal would be virtually distortion-free. However, this perfect correction may result in insufficient spectral reduction of the frequency-modulated spectrum outside its intended passband (e.g., ±100 kHz for MP4). If the 0 to 53 kHz band is only partially corrected, then better bandwidth reduction can be achieved at the expense of some audio distortion. A goal here is to control the correction to achieve an acceptable level of bandwidth reduction while the distortion is controlled to acceptably good levels. This compromise limits over-correction while achieving better bandwidth reduction.

Figure 8:
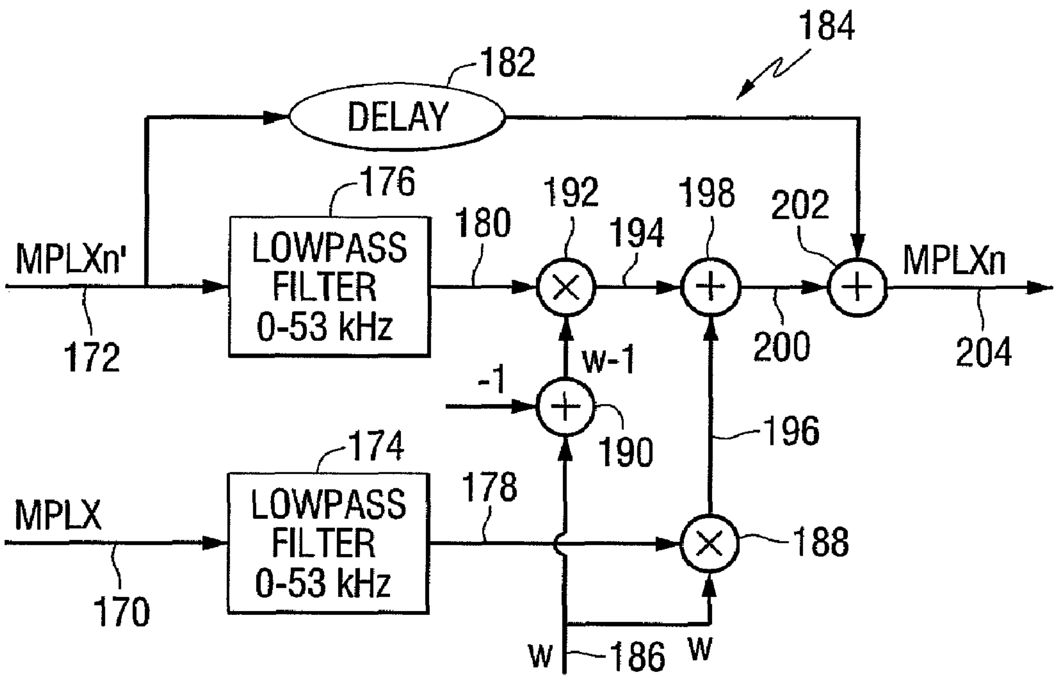
FIG. 8 is a functional block diagram of multiplex baseband correction for each iteration of the procedure of FIG. 7.

A functional block diagram showing details of the baseband correction block (CORRECT MPLX) for each interation is shown in FIG. 8. The original baseband multiplex signal on line 170 and the detected FM signals for iteration n on line 172 are filtered by low pass filters 174 and 176, respectively to produce a first filtered signal on line 178 and a second filtered signal on line 180. A delay 182 is inserted in the top path 184 to match the group delay of the filter 176. A weight w applied to line 186 is used to control the amount of baseband correction for each iteration. The first filtered signal is multiplied by the weight as shown by multiplier 188, and the second filtered signal is multiplied by the weight value minus 1, as shown by summation point 190 and multiplier 192. The weighted signals on lines 194 and 196 are combined in summation point 198 to produce a combined weighted signal on line 200. In the combined weighted signal, the 0-53 kHz portion of the detected FM signal for interation n is replaced with the weighted original baseband signal. The combined weighted signal on line 200 is added to the delayed detected FM signals for iteration n on line 202 to produce a corrected baseband multiplex signal on line 204. The weighting factors are adjustable and can be frequency dependent. In one embodiment, the sum of the first and second weighting factors is 1.

Although the 0-53 kHz lowpass filter may have a flat passband characteristic, it is possible to shape this filter to emphasize correction of the L−R signal, where most of the correction is needed. This may be beneficial since human perception of the noise is frequency-dependent, and the ability to spectrally shape the noise in the precompensation process may further improve performance. However the exact shape of this filtering is left to the implementer to achieve better subjective sound quality.

A weight value of zero applies no correction (useless) while a value of one applies full correction at each iteration for a distortionless output. Values of w between 0.5 and 1.0 have proven to be most effective and achieve the desired balance between bandwidth reduction and distortion. Although it is possible to eliminate the lowpass filter in the MPLX path of the original input signal, this filter accommodates variations in the passband where the gain deviates from one. When w=0.5, filter passband variations will cancel to yield a flat multiplex baseband characteristic. So this (w=0.5) is a preferred value to reduce requirements on the filtering. However, this lowpass filter needs only one iteration since it computes the same output each time. So the implementation can be simplified by prefiltering the MPLX signal only once, independent of the number of iterations. This function replaces the portion of the detected baseband multiplex signal (MPLXn') from 0 to 53 kHz with a weighted version of the original undistorted signal MPLX. The portion of the MPLXn' signal from 53 kHz to about 100 kHz remains in the output as the precompensation component of the signal. Although the 0-53 kHz lowpass filter may have a flat passband characteristic, it is possible to shape this filter to emphasize correction of the L−R signal, where most of the correction is needed.

Figure 9:
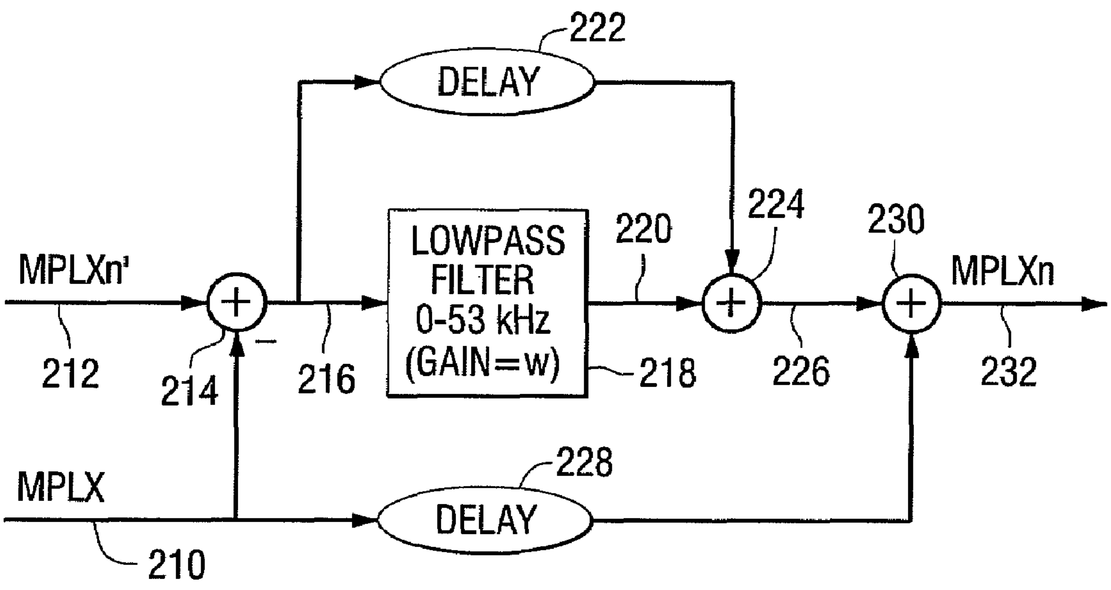
FIG. 9 is an alternative functional block diagram of multiplex baseband correction for each iteration of the procedure of FIG. 7.

An alternative implementation of the baseband correction block (CORRECT MPLX) is shown in FIG. 9. The original baseband multiplex signal on line 210 is subtracted from the detected FM signals for iteration n on line 212 at combiner 214 to produce an unfiltered precompensation signal (also called a difference signal) on line 216. The unfiltered precompensation signal on line 216 is filtered by a lowpass filter 218 to produce a filtered signal on line 220, which is added to a delayed 222 version of the unfiltered precompensation signal in combiner 224 to produce a filtered precompensation signal on line 226. The filtered precompensation signal on line 226 is then added to a delayed 228 version of the original baseband multiplex signal at summation point 230 to produce the corrected baseband multiplex signal on line 232.

This alternative implementation avoids the sensitivity of the weight parameter when w≠0.5. It also allows more flexibility in the precompensation filtering such that the filter characteristic can be better matched to improve the compromise between bandwidth reduction and audio fidelity (SNR). The lowpass filter can have a passband from 0 to 53 kHz with a gain equal to the value of w of the previous implementation. A gain of 0.5 in the lowpass filter passband corresponds to w=0.5 in the previous implementation. This filter requires a (nearly) linear phase characteristic in the passband, while the stopband may have an arbitrary phase where the signal gain is attenuated. This characteristic allows a FIR filter implementation with inherent linear phase, while an IIR filter with passband phase equalization may suffice for a more computationally-efficient implementation.

The bandwidth reduction procedure has been simulated for several bandwidths. A value of w=0.5 was used to control the compromise between bandwidth reduction and distortion. The correction bandwidth was actually 54 kHz instead of 53 kHz to ensure some margin. The simulation included 8 iterations, and the receiver bandwidth was matched to the transmit bandwidth for best compatibility. Spectral plots of the FM output signal corresponding to hybrid modes MP1, MP2, MP3, and MP4 are shown in FIGS. 10 through 13, respectively.

Figure 10:
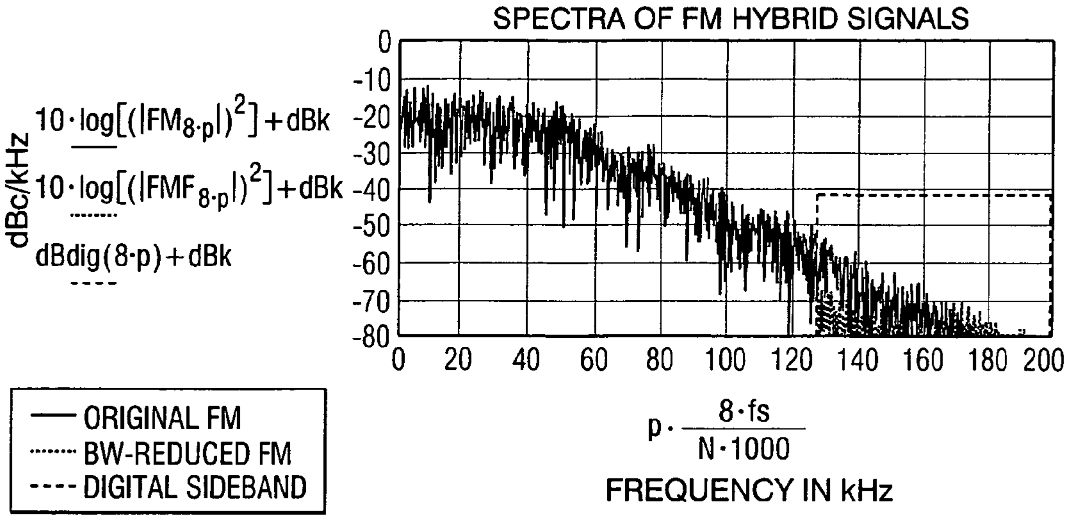
FIG. 10 is a plot of simulation results for the hybrid mode MP1 spectrum (128 kHz bandwidth).
Figure 11:
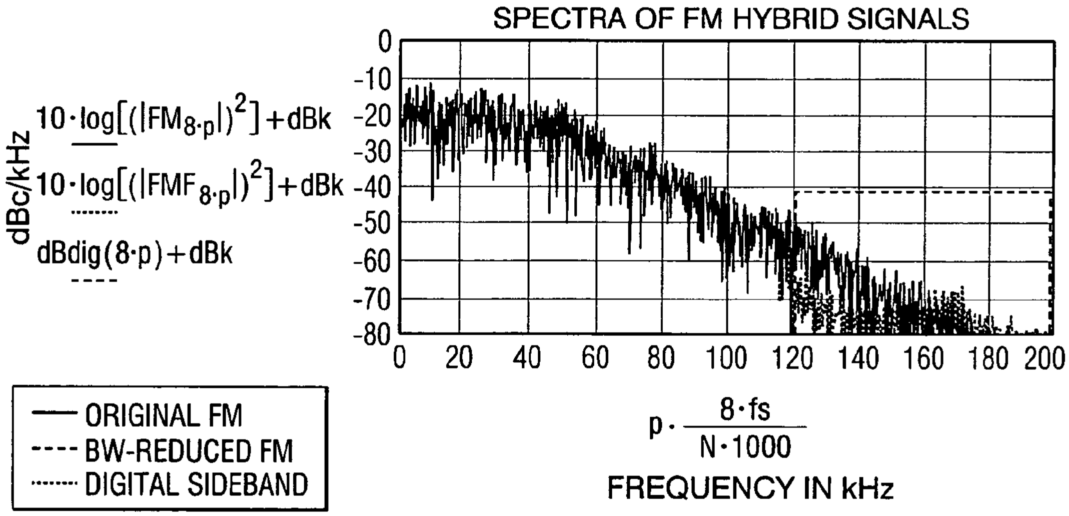
FIG. 11 is a plot of simulation results for the hybrid mode MP2 spectrum (121 kHz bandwidth).
Figure 12:
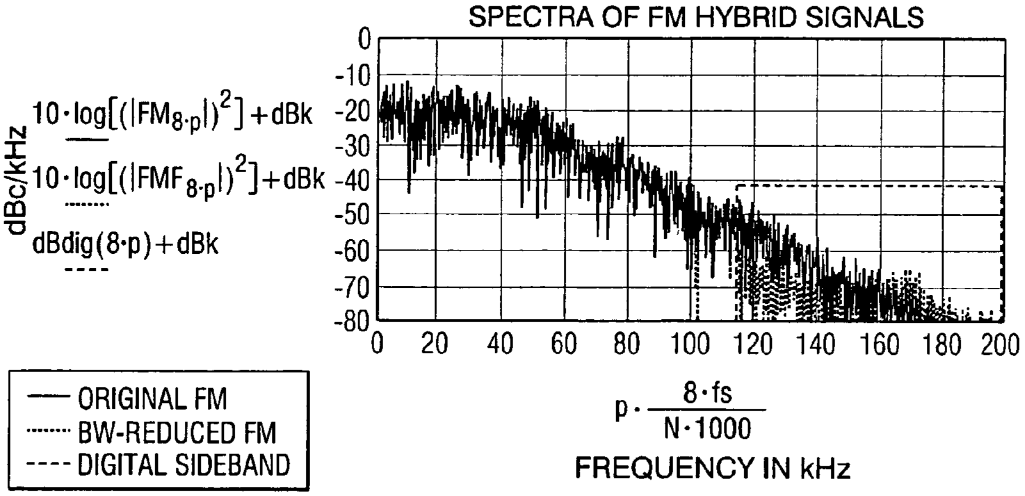
FIG. 12 is a plot of simulation results for the hybrid mode MP3 spectrum (114 kHz bandwidth).
Figure 13:
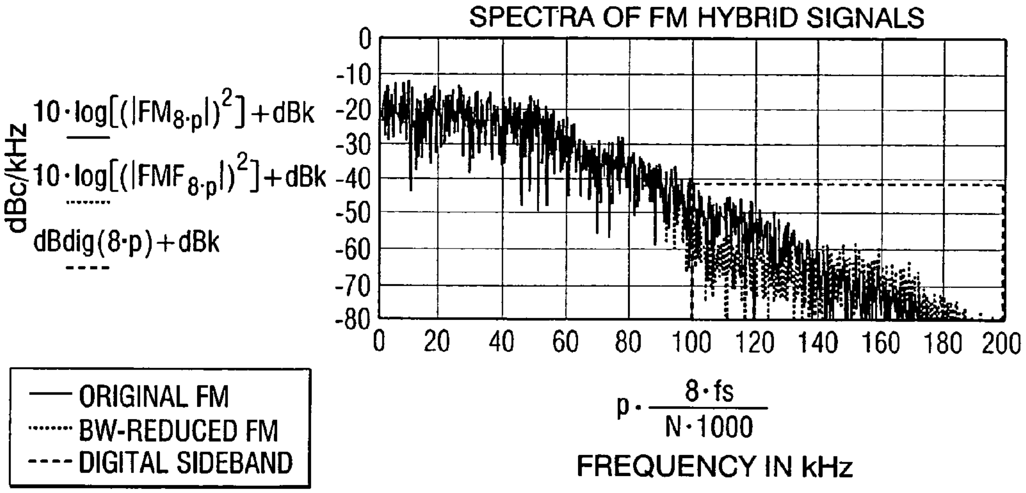
FIG. 13 is a plot of simulation results for the hybrid mode MP4 spectrum (100 kHz bandwidth).

FIG. 10 shows the simulation results for a hybrid mode MP1 spectrum (128 kHz bandwidth). FIG. 11 shows the simulation results for a hybrid mode MP2 spectrum (121 kHz bandwidth). FIG. 12 shows the simulation results for a hybrid mode MP3 spectrum (114 kHz bandwidth). FIG. 13 shows the simulation results for a hybrid mode MP4 spectrum (100 kHz bandwidth).

Figure 14:
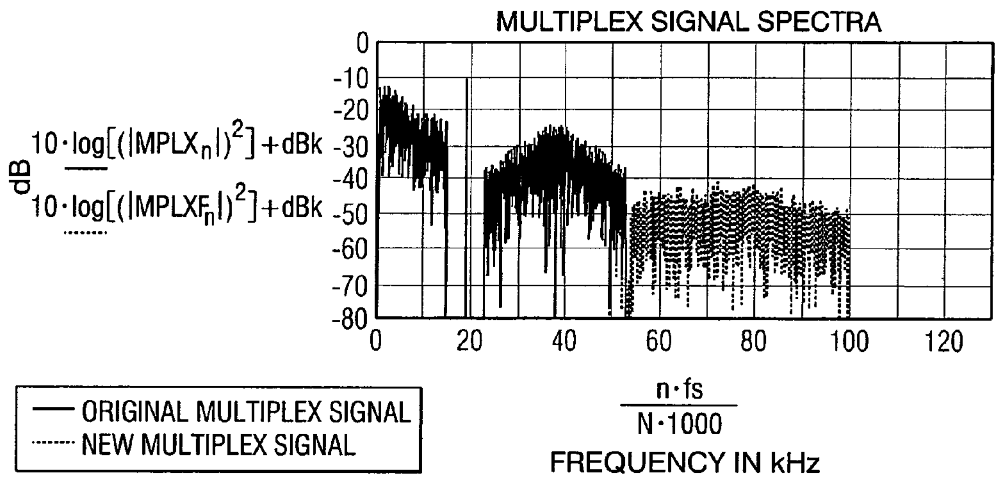
FIG. 14 is a plot of simulation results for the hybrid mode MP4 multiplex baseband spectrum showing a precorrection signal occupying the bandwidth from about 54 kHz to 100 kHz.

FIG. 14 shows the simulation results for a hybrid mode MP4 multiplex baseband spectrum showing a precorrection signal occupying the bandwidth from about 54 kHz to 100 kHz. It is interesting to observe that the 0-53 kHz bandwidth is minimally distorted while the precompensation portion of this signal resides in the 54 to 100 kHz region. Compatibility with SCAs may be affected due to the precompensation.

A summary of the simulation performance results is tabulated in Table 2. The SNR results show 2 values (value1/value2). The first value is the precompensation SNR and the second value is the SNR achieved with the receiver filtering only for comparison. It is interesting to observe that all SNRs improved while the bandwidth reduction (attenuation) is achieved.

TABLE 2

SNR of Received/Demodulated Mono and Stereo (Difference) Signals as a Function of TX Bandwidth Control Using Receiver Bandwidth Filter Matched to the Transmitter Bandwidth (w = 0.5).

| | TX BW control | | | |
|---|---|---|---|---|
| | +−128 kHz | +−121 kHz | +−114 kHz | +−100 kHz |
| SNR mono | 102/92 | 97/86 | 92/82 | 77/70 |
| SNR stereo | 70/59 | 64/53 | 58/48 | 45/39 |
| Attenuation dB at edge | 16 | 16 | 15 | 14 |

A method of reducing the bandwidth of an FM broadcast signal has been described and simulated. This method offers sufficient suppression of the analog FM signal in the region of the extended digital subcarriers for the FM IBOC hybrid modes. Additionally, this method improves the stereo performance of selective receivers used to mitigate adjacent channel interference, and is useful for existing analog FM broadcast signals to improve adjacent channel interference performance while improving fidelity in existing selective receivers.

Although the various steps of the invention have been described in terms of functional block diagrams, it should be apparent that those steps can be implemented in one or more electronic circuits or processors. In one embodiment, the electronic circuits or processors include a first frequency modulator, a filter, a detector, a correction circuit, and a second frequency modulator.

While the invention has been described in terms of several embodiments, it will be apparent to those skilled in the art that various changes can be made to the disclosed embodiments without departing from the scope of the invention as defined in the following claims.

What is claimed is:

1. A method of processing a baseband multiplex signal, the method comprising:

frequency modulating the baseband multiplex signal using a first frequency modulator to produce a first modulated signal;

filtering the first modulated signal to produce a first filtered signal;

detecting the first filtered signal to produce a first detected baseband multiplex signal;

correcting the first detected baseband multiplex signal to reduce or eliminate distortion in a predetermined frequency range of the first detected baseband multiplex signal to produce a first corrected signal;

frequency modulating the first corrected signal using a second frequency modulator to produce a second modulated signal;

detecting the second modulated signal to produce a second detected baseband multiplex signal;

correcting the second detected baseband multiplex signal to reduce or eliminate distortion in a predetermined frequency range of the second detected baseband multiplex signal to produce a second corrected signal; and frequency modulating the second corrected signal to produce a third modulated signal.

2. The method of claim 1, wherein the predetermined frequency range of the first detected baseband multiplex signal is about 0 to 53 kHz.

3. The method of claim 1, further comprising:

filtering the second modulated signal prior to the step of detecting the second modulated signal.

4. The method of claim 3, further comprising:

filtering the third modulated signal to produce a third filtered signal;

detecting the third filtered signal to produce a third detected baseband multiplex signal;

correcting the third detected baseband multiplex signal to reduce or eliminate distortion in a predetermined frequency range of the third detected baseband multiplex signal to produce a third corrected signal; and frequency modulating the third corrected signal to produce a fourth modulated signal.

5. A method of processing a baseband multiplex signal, the method comprising:

frequency modulating the baseband multiplex signal using a first frequency modulator to produce a first modulated signal;

filtering the first modulated signal to produce a first filtered signal;

detecting the first filtered signal to produce a first detected baseband multiplex signal;

correcting the first detected baseband multiplex signal to reduce or eliminate distortion in a predetermined frequency range of the first detected baseband multiplex signal to produce a first corrected signal;

frequency modulating the first corrected signal using a second frequency modulator to produce a second modulated signal;

wherein the step of correcting the detected baseband multiplex signal to reduce or eliminate distortion in a predetermined frequency range comprises the steps of:

subtracting the baseband multiplex signal from the first detected baseband multiplex signal to produce a difference signal;

filtering the difference signal to produce a second filtered signal;

adding a delayed version of the difference signal to the second filtered signal to produce a filtered precompensation signal; and adding a delayed version of the baseband multiplex signal to the filtered precompensation signal to produce the first corrected signal.

6. A method of processing a baseband multiplex signal, the method comprising:

frequency modulating the baseband multiplex signal using a first frequency modulator to produce a first modulated signal;

filtering the first modulated signal to produce a first filtered signal;

detecting the first filtered signal to produce a first detected baseband multiplex signal;

correcting the first detected baseband multiplex signal to reduce or eliminate distortion in a predetermined frequency range of the first detected baseband multiplex signal to produce a first corrected signal;

frequency modulating the first corrected signal using a second frequency modulator to produce a second modulated signal;

wherein the step of correcting the detected baseband multiplex signal to reduce or eliminate distortion in a predetermined frequency range comprises the steps of:

filtering the baseband multiplex signal to produce a second filtered signal;

filtering the first detected baseband multiplex signal to produce a third filtered signal;

multiplying the second filtered signal by a first weighting factor to produce a first weighted signal;

multiplying the third filtered signal by a second weighting factor to produce a second weighted signal;

combining the first and second weighted signals to produce a combined weighted signal; and combining the combined weighted signal with a delayed version of the first detected baseband multiplex signal to produce the first corrected signal.

7. The method of claim 6, wherein each of the first and second weighting factors ranges from 0 to 1 and the sum of the first and second weighting factors is 1.

8. The method of claim 6, wherein each of the first and second weighting factors are frequency dependent.

9. The method of claim 6, wherein each of the first and second weighting factors is adjustable.

10. An apparatus for processing a baseband multiplex signal, the apparatus comprising:

a first frequency modulator for frequency modulating the baseband multiplex signal to produce a first modulated signal;

a first filter for filtering the first modulated signal to produce a first filtered signal;

a detector for detecting the first filtered signal to produce a first detected baseband multiplex signal;

a correction circuit for correcting the first detected baseband multiplex signal to reduce or eliminate distortion in a predetermined frequency range of the first detected baseband multiplex signal to produce a first corrected signal;

a second frequency modulator for frequency modulating the first corrected signal to produce a second modulated signal;

wherein the correction circuit comprises:

a first combiner for subtracting the baseband multiplex signal from the first detected baseband multiplex signal to produce a difference signal;

a second filter for filtering the difference signal to produce a second filtered signal;

a second combiner for adding a delayed version of the difference signal to the second filtered signal to produce a filtered precompensation signal; and a third combiner for adding a delayed version of the baseband multiplex signal to the filtered precompensation signal to produce the first corrected signal.

11. The apparatus of claim 10, wherein the predetermined frequency range is about 0 to 53 kHz.

12. The apparatus of claim 10, wherein the first frequency modulator, the first filter, the detector, the correction circuit, and the second frequency modulator are implemented in one or more processors.

13. An apparatus for processing a baseband multiplex signal, the apparatus comprising:

a first frequency modulator for frequency modulating the baseband multiplex signal to produce a first modulated signal;

a first filter for filtering the first modulated signal to produce a first filtered signal;

a detector for detecting the first filtered signal to produce a first detected baseband multiplex signal;

a correction circuit for correcting the first detected baseband multiplex signal to reduce or eliminate distortion in a predetermined frequency range of the first detected baseband multiplex signal to produce a first corrected signal;

a second frequency modulator for frequency modulating the first corrected signal to produce a second modulated signal;

wherein the correction circuit comprises:

a second filter for filtering the baseband multiplex signal to produce a second filtered signal;

a third filter for filtering the first detected baseband multiplex signal to produce a third filtered signal;

a first multiplier for multiplying the second filtered signal by a first weighting factor to produce a first weighted signal;

a second multiplier for multiplying the third filtered signal by a second weighting factor to produce a second weighted signal;

a first combiner for combining the first and second weighted signals to produce a combined weighted signal; and a second combiner for combining the combined weighted signal with a delayed version of the first detected baseband multiplex signal to produce the first corrected signal.

14. The apparatus of claim 13, wherein each of the first and second weighting factors ranges from 0 to 1 and the sum of the first and second weighting factors is 1.

15. The apparatus of claim 13, wherein each of the first and second weighting factors are frequency dependent.

16. The apparatus of claim 13, wherein each of the first and second weighting factors are adjustable.

17. An apparatus for processing a baseband multiplex signal, the apparatus comprising:

means for frequency modulating the baseband multiplex signal to produce a first modulated signal;

means for filtering the first modulated signal to produce a first filtered signal;

means for detecting the filtered signal to produce a detected baseband multiplex signal;

means for correcting the detected baseband multiplex signal to reduce or eliminate distortion in a predetermined frequency range of the detected baseband multiplex signal to produce a corrected signal;

means for frequency modulating the corrected signal to produce a second modulated signal;

wherein the means for correcting the detected baseband multiplex signal comprises:

means for filtering the baseband multiplex signal to produce a second filtered signal;

means for filtering the detected baseband multiplex signal to produce a third filtered signal;

means for multiplying the second filtered signal by a first weighting factor to produce a first weighted signal;

means for multiplying the third filtered signal by a second weighting factor to produce a second weighted signal;

means for combining the first and second weighted signals to produce a combined weighted signal; and means for combining the combined weighted signal with a delayed version of the detected baseband multiplex signal to produce the corrected signal.

18. The apparatus of claim 17, wherein the predetermined frequency range is about 0 to 53 kHz.

19. The apparatus of claim 17, wherein the means for frequency modulating the baseband multiplex signal to produce a first modulated signal, the means for filtering the first modulated signal to produce a first filtered signal, the means for detecting the filtered signal to produce a detected baseband multiplex signal, the means for correcting the detected baseband multiplex signal to reduce or eliminate distortion in a predetermined frequency range of the detected baseband multiplex signal to produce a corrected signal, and the means for frequency modulating the corrected signal to produce a second modulated signal, are implemented in one or more processors.

20. The apparatus of claim 17, wherein each of the first and second weighting factors ranges from 0 to 1 and the sum of the first and second weighting factors is 1.

21. The apparatus of claim 17, wherein each of the first and second weighting factors are frequency dependent.

22. The apparatus of claim 17, wherein each of the first and second weighting factors are adjustable.

23. An apparatus for processing a baseband multiplex signal, the apparatus comprising:

means for frequency modulating the baseband multiplex signal to produce a first modulated signal;

means for filtering the first modulated signal to produce a first filtered signal;

means for detecting the filtered signal to produce a detected baseband multiplex signal;

means for correcting the detected baseband multiplex signal to reduce or eliminate distortion in a predetermined frequency range of the detected baseband multiplex signal to produce a corrected signal;

means for frequency modulating the corrected signal to produce a second modulated signal;

wherein the correction circuit comprises:

means for subtracting the baseband multiplex signal from the detected baseband multiplex signal to produce a difference signal;

means for filtering the difference signal to produce a second filtered signal;

means for adding to a delayed version of the difference signal to the second filtered signal to produce a filtered precompensation signal; and means for adding a delayed version of the baseband multiplex signal to the filtered precompensation signal to produce the corrected signal.

24. A method of processing a baseband multiplex signal, the method comprising:

frequency modulating the baseband multiplex signal using a first frequency modulator to produce a first modulated signal;

filtering the first modulated signal to produce a first filtered signal;

detecting the first filtered signal to produce a first detected baseband multiplex signal;

correcting the first detected baseband multiplex signal to reduce or eliminate distortion in a predetermined frequency range of the first detected baseband multiplex signal to produce a first corrected signal;

wherein the step of correcting the first detected baseband multiplex signal includes lowpass filtering the baseband multiplex signal to produce a second filtered signal, lowpass filtering the first detected baseband multiplex signal to produce a third filtered signal, weighting the second and third filtered signals and combining the weighted second filtered signal and weighted third filtered signal to produce a combined weighted signal, delaying the first detected baseband multiplex signal and combining the delayed first detected baseband multiplex signal with the combined weighted signal to produce the first corrected signal; and frequency modulating the first corrected signal using a second frequency modulator to produce a second modulated signal.

25. A method of processing a baseband multiplex signal, the method comprising:

frequency modulating the baseband multiplex signal using a first frequency modulator to produce a first modulated signal;

filtering the first modulated signal to produce a first filtered signal;

detecting the first filtered signal to produce a first detected baseband multiplex signal;

correcting the first detected baseband multiplex signal to reduce or eliminate distortion in a predetermined frequency range of the first detected baseband multiplex signal to produce a first corrected signal;

wherein the step of correcting the first detected baseband multiplex signal includes subtracting the baseband multiplex signal from the first detected baseband multiplex signal to produce a precompensation signal, lowpass filtering the precompensation signal to produce a second filtered signal, delaying the precompensation signal and combining the delayed precompensation signal with the second filtered signal to produce a filtered precompensation signal, delaying the baseband multiplex signal and combining the delayed baseband multiplex signal with the filtered precompensation signal to produce the first corrected signal; and frequency modulating the first corrected signal using a second frequency modulator to produce a second modulated signal.

26. The method of claim 25 wherein:

the predetermined frequency range is about 0 to about 53 kHz; and the precompensation signal includes a portion in the frequency range of about 53 kHz to about 100 kHz.

* * * * *